April 14, 1959 M. J. MANAHAN 2,882,391

ELECTRIC RADIO TUNER

Filed Sept. 7, 1954 2 Sheets-Sheet 1

INVENTOR
Max J. Manahan
BY R. E. Fowler
ATTORNEY

April 14, 1959 M. J. MANAHAN 2,882,391

ELECTRIC RADIO TUNER

Filed Sept. 7, 1954 2 Sheets-Sheet 2

INVENTOR
Max J. Manahan
BY
R. E. Fowler
ATTORNEY

United States Patent Office 2,882,391
Patented Apr. 14, 1959

2,882,391

ELECTRIC RADIO TUNER

Max J. Manahan, Kokomo, Ind., assignor to General Motors Corporation, Detroit, Mich., a corporation of Delaware Application September 7, 1954, Serial No. 454,504

13 Claims. (Cl. 250—20)

This invention relates to impedance varying means and more specifically to means for varying the inductance of members in order to adjust the tuning or resonant frequency of electrical circuits to tune radio apparatus.

In radio apparatus, a plurality of tunable resonant circuits are provided to tune to a plurality of different frequencies in the band for which the apparatus is designed. Resonant circuits consist of both inductance and capacity and the adjustment or variation to tune may be accomplished by varying either the inductance or capacity. In the early radio apparatus the resonant circuits were usually tuned by variable condensers. In later apparatus the tuning was accomplished by varying the inductance through varying the position of powdered iron cores within their associated coils. In each of these cases parts are physically moved to vary the inductance or capacity in order to tune the apparatus.

It is an object in making this invention to provide means for changing an impedance which has no moving parts.

It is a further object in making this invention to provide tunable means for varying the resonant frequency of a circuit which has no movable means.

It is a still further object in making this invention to provide a ganged tuning means for radio receiving apparatus that has no moving parts and is completely electrical.

It is yet a further object in making this invention to provide a completely electrical ganged variable inductance tuning means.

It is a still further object in making this invention to provide a ganged electrical variable inductance tuning means which is indexed by the receipt of an incoming signal and is of the "signal seeking" or "signal tuned" type.

Figure 1:
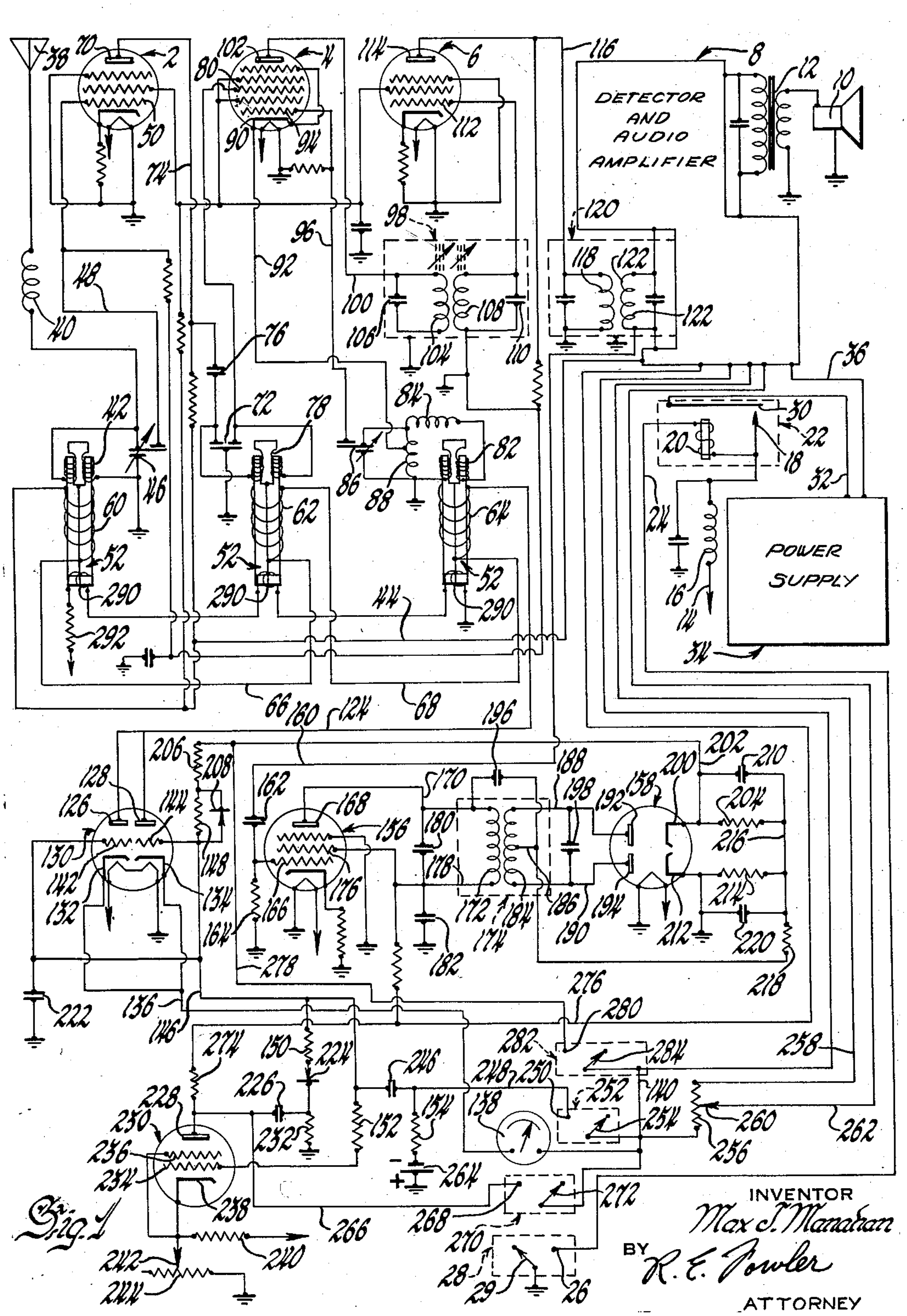
Figure 2:
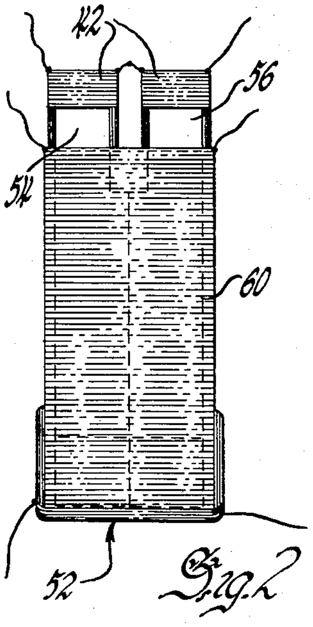
Figure 3:
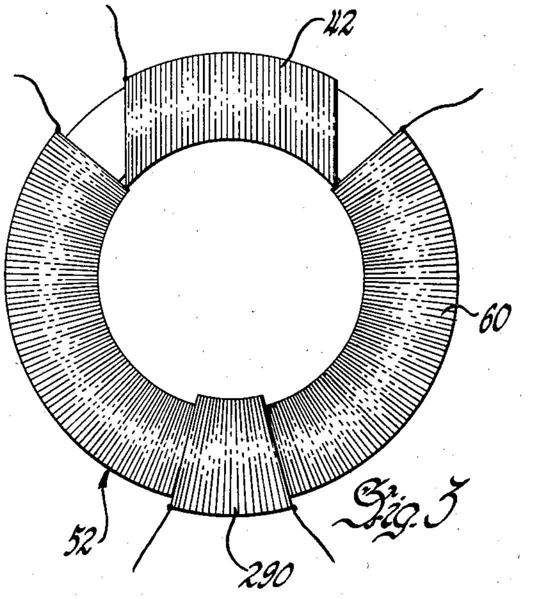
Figure 4:
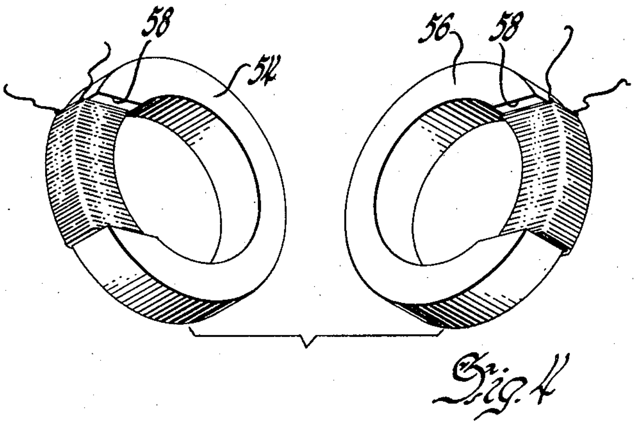

With these and other objects in view which will become apparent as the specification proceeds, my invention will be best understood by reference to the following specification and claims and the illustrations in the accompanying drawings, in which:

Figure 1 is a combination circuit and block diagram of a radio receiver embodying my invention Figure 2 is an end view of one of the induction coil and core assemblies, several times normal size Figure 3 is a side view of the coil and core; and Figure 4 is an exploded view of the parts before assembly.

In the permeability type of tuning means which is currently employed in radio apparatus, the inductance of the coils in the resonant circuits is changed by physically moving cores made of finely ground iron particles bonded together, into and out of their associated coils. The inductance of coils can also be varied by changing the magnetizing or magnetization of a stationary core associated with a coil. This may be accomplished by having a separate magnetizing coil on the common core and varying the current flowing through said separate coil. This changes the inductance of the coil as desired by selecting the proper components without any physical movement.

Applying this principle to a radio receiver, in general, my tuning means consists of three inductance coils mounted on cores, each core having a separate magnetizing winding through which the current is varied according to a given pattern. These three coils are connected in the antenna, radio frequency and oscillator circuits to tune the radio apparatus. The current through the magnetizing coils, which are connected in series, is varied from a low value to a high value to tune the apparatus over a prescribed frequency band. While there may be various manners in which this may be accomplished, as an example, and in no wise in a limiting sense, I have shown an electron tube in series with said magnetizing coils and a source of power, whose conductance is changed in a given pattern. A condenser is connected to the control grid of the electron tube to control the conductance of the same. By permitting the condenser to discharge, the conductance of the tube will change gradually, causing the inductance of the tuning coils to change and the resonant tuned circuits to be tuned over the band.

Referring now more particularly to the system shown in Figure 1, there is there shown a radio receiving circuit of the superheterodyne type. A radio frequency amplifier tube 2, a converter or mixer tube 4, and an intermediate frequency amplifier tube 6 with their associated circuits form the high frequency amplifier which feeds directly into the detector and audio amplifier stage 8. The output of the audio amplifier 8 is fed to a loud speaker 10 through coupling transformer 12. The power lead 14 of the receiver may be connected to any suitable source such as a storage battery (not shown). This lead is connected through a choke 16 to stationary contact 18 of a control relay switch 22 and also to one terminal of the relay operating coil 20 of the control relay 22. Relay coil 20 is also connected through line 24 to stationary contact 26 of an off-on switch 28, the movable cooperating arm 29 of which is connected to ground. Armature 30 of the control relay 22 which engages contact 18 when the coil 20 is energized, is connected to line 32 extending to the power supply unit 34 to supply low voltage direct current thereto when the switch is closed.

Unit 34 may be an interrupter-transformer unit or power pack or similar means to provide high voltage power to the apparatus. The output of this unit 34 is applied to line 36 and thence to the detector and amplifying unit 8 to supply power thereto and through said unit 8 to supply lines 44 and 276 for the remainder of the apparatus.

The radio frequency amplifier section consisting of tubes 2, 4, and 6 is tuned by varying the inductances in their associated resonant circuits. The antenna 38 is connected through coil 40 to one terminal of a tunable coil 42, the opposite side of which is grounded. The specific construction of the coil and core assembly is shown in Figures 2 and 3 and will be later described in detail. An adjustable condenser 46 is connected across coil 42 and, through a fixed capacity built into this trimmer, is coupled through lead 48 to the control grid 50 of the tube 2.

The coil 42 is mounted or wound on a composite core 52 formed of two rings 54 and 56 of ferrite or some similar magnetic substance. On one side of each ring a notch 58 is ground and a section of the coil 42 is wound on each ring in series as shown. The two rings are then placed face to face with the notches 58 aligned and the assembly rigidly secured. Magnetizing winding 60 is then wound around the assembly to control the magnetization of the core. Each of the tuning coil assemblies is fabricated in the same manner and then magnetizing coil 60 is connected in series with magnetizing coils 62 and 64 for the other two cores by interconnecting lines 66 and 68 respectively. Line 44 is directly connected to one terminal of the magnetizing coil 60 to supply power to the series circuit. The plate 70 of the tube 2 is connected to the adjustable condenser 72 of the next amplifier stage through line 74 and condenser 76. Condenser 72 is part of the resonant circuit for the radio frequency stage and is connected across the tunable inductance coil 78 which is connected to the control grid 80 of the tube 4.

The local oscillator includes an inductance coil 82 on its core 52. One terminal of the coil 82 is connected to a series coil 84 and thence to one terminal of the adjustable condenser 86. One side of the condenser is grounded. A shunt inductance coil 88 is center tapped and is connected across the condenser 86, the tap being connected to the cathode 90 of the tube 4 through line 92. The condenser 86 is also connected to the oscillator grid 94 through line 96. The tube 4 is the tube in which the incoming modulated radio frequency signal is mixed with the locally generated oscillations to convert to the intermediate frequency signal. The series coil 84 and the shunt coil 88 are utilized for tracking purposes so that the frequency of the oscillator will change in the same proportion that the radio frequency changes to maintain a constant frequency difference therewith throughout the band.

The output of the mixer tube 4 is fed to the intermediate frequency transformer 98 through the connection 100 between the plate 102 of tube 4 and the primary 104. A condenser 106 is connected across the primary 104 to tune the same to the intermediate frequency. The secondary 108 of the transformer is tuned by condenser 110 and connected to control grid 112 of the amplifier tube 6. The plate 114 of the tube 6 is connected by line 116 to tuned primary 118 of the second intermediate frequency transformer 120. The secondary 122 of the transformer 120 is connected directly to the detector and audio amplifier section 8. The inductance of the tuning coils 42, 78 and 82 is varied by changing the flux in the core 52 upon which each is mounted, which flux in turn is varied by changing the flow of current through the magnetizing coils 60, 62 and 64 respectively. These latter coils are connected in series and to the power line 44. To control the flow of current, the last coil 64 is connected through line 124 to the plates 126 and 128 of a duo-triode tube 130. This tube may be a single triode as well, the present form being shown for illustrative purposes only. The cathodes 132 and 134 are commonly connected through line 136 with one terminal of a milliammeter 138 to read the current flow in this tube circuit. The opposite side of the ammeter 138 is connected to line 140 which is grounded. Thus the tube 130 is connected in series with the magnetizing coils 42, 62 and 64 and controls the flow of current therethrough. The meter 138 is also included in this series connection and since the current flow in this circuit is proportional to the tuning of the resonant circuits, may be calibrated in frequencies of the band covered.

The conductivity through the tube 130 is controlled by the grids 142 and 144 which are commonly connected to line 146 which couples one end of a resistor 148 to one terminal of resistors 150 and 152. To control the potential on line 146 there is provided a limiter stage including tube 156, which is fed by the intermediate frequency transformer 120 and a discriminator stage including tube 158. Thus a signal is applied to line 146 dependent upon the output of the transformer 120.

In detail the transformer secondary 122 is connected by line 160 to a coupling condenser 162 and thence through a resistance 164 to ground. The control grid 166 of the limiter tube 156 is connected to a point intermediate the condenser 162 and the resistor 164. The plate 168 of tube 156 is connected through line 170 to the primary coil 172 of a coupling transformer 174. The opposite terminal of the primary is connected to screen grid 176 through line 178. A condenser 180 is connected across lines 170 and 178 and a condenser 182 is connected between line 178 and ground. The secondary 184 of the transformer is center tapped at 186 and the two outer terminals are connected through lines 188 and 190 respectively with anodes 192 and 194 of the tube 158. Condenser 196 is connected between line 170 and center tap 186. Condenser 198 is connected across the secondary 184.

The discriminator is therefore fed from transformer 174. One of the cathodes 200 is connected to the output line 202 and to one terminal of resistor 204. Line 202 is in turn connected to resistor 206 in series with resistor 148. A rectifier 208 is connected across resistor 148. A condenser 210 is connected across resistor 204. The other cathode 212 of the discriminator tube 158 is connected to a resistor 214. Line 216 commonly connects the opposite terminals of resistors 204 and 214 and one terminal of resistor 218. The opposite terminal of resistor 218 is directly connected to center tap 186 of the secondary 184. A condenser 220 is connected across resistor 214. The output from the discriminator applies an automatic frequency control and is tuned to the intermediate frequency of the system. This furnishes the stopping and locking-in pulse to index the receiver on station.

In order to cause the resonant circuits to scan the band of frequencies which they are designed to cover, means are provided to cause the current flowing through the magnetizing windings to slowly increase at a uniform rate. This is accomplishetd by connecting a condenser 222 carrying a high negative charge, to the control grids 142 and 144 of the tube 130. This sets the magnetization for one end of the band and determines the flow through the magnetization coils, in this instance, at the low end of the band. The condenser is permitted to discharge gradually for tuning over the band. The circuitry associated with the condenser through which it is charged and discharged is shown in the main in the lower part of the drawing. Line 146 connects the condenser 222 to resistor 150, the opposite terminal of the latter being connected through rectifier 224 and condenser 226 in series to the plate 228 of the charging control electron tube 230. A resistance 232 is connected between ground and a point intermediate the rectifier 224 and condenser 226. Line 146 is also connected to a resistor 152, the opposite terminal of which is connected to the control grid 234 of tube 230. The screen or suppressor grid 236 and cathode 238 of the tube 230 are tied together and connected through a resistance 240 to a low voltage source of power such as a storage battery of a vehicle. The screen and cathode are also connected to the adjustable tap 242 on resistor 244 which is grounded to adjust the cathode and screen bias, and thus the operating point of the tube. A condenser 246 has one terminal connected to line 146 and the other to line 248 which extends to a stationary switch point 250 on switch 252. The adjustable arm 254 of switch 252 is connected to line 140 and to one end of a volume control resistor 256, the opposite end of which is connected through line 258 to a point in the audio amplifier 8. A variable tap 260 on resistor 256 is also connected back to another point in the audio amplifier through line 262. Adjustment of the tap provides volume control.

Line 248 is connected to a resistor 154, the latter being connected to a biasing battery 264 having its positive pole grounded. The plate 228 of tube 230 is connected through conductor 266 with a stationary contact 268 of a switch 270. The movable contact 272 of the switch 270 is connected to line 140. Plate 228 is also connected through resistor 274 to high voltage supply line 276 which extends to the audio amplifier section. Line 278 interconnects line 202 with stationary contact 280 of the manual switch 282, the movable arm 284 of which is connected to line 140 and ground. The four manually operable switches 28, 270, 252 and 282 and the tuning meter 138 may, if desired, all be mounted on a control panel for the operator's convenience.

In general, therefore, it will be seen that the three resonant circuits for tuning the receiver are tuned over the band by changing the current flow from zero or a low value to a higher value by gradually changing the conductivity of the electron tube 130 in series therewith. The limiter and discriminator circuits which develop an automatic frequency control signal on line 202, index or stop the tuning action when a signal is tuned in. To pass to the next station in the band the operator momentarily closes switch 252 which permits condenser 246 to discharge and provide a positive pulse on the control grids 142 and 144 of sufficient size and duration to overcome the AFC action of the discriminator output and move off the station to which the set has been tuned. It will stop on the next station that provides a control pulse hrough the discriminator. If it is desired to move to some remote part of the band the operator closes switch 282 and holds it closed until the tuner reaches the neighborhood desired. No stopping signal can be applied during this time. Upon release of switch 282, the tuner will stop on the next received signal. Means is also provided to return to the opposite end of the band once the tuner has moved to the high frequency limit. Broadly this is accomplished by recharging condenser 222 negatively through the action of condenser 226 discharging through tube 230.

To more specifically describe the operation of my system, the operator first closes the off-on switch 28. This completes an obvious energizing circuit for relay coil 20, which closes the switch 18—30 and applies the low voltage from the battery source to the power supply unit 34. A short time is then allowed to permit the apparatus to warm up. The tuner will stop or index on the first station that is encountered after the apparatus is sufficiently heated to produce a proper incoming signal at the discriminator 158. Upon this index the signal being received will be detected, amplified and applied to the speaker 10. The receiver will stay tuned to this station until the operator desires to index another. To stay on the station the normal action of automatic frequency control is utilized. The discriminator transformer 174 is tuned to the intermediate frequency of the receiver which may, for example, be 262 kilocycles. The output of the discriminator is developed across the two resistors 214 and 204 and are connected so that the voltages so developed by the rectifier are of opposed polarities and at signal resonance no control voltage is applied to line 202. However, if the frequency delivered to the discriminator tends to increase, a voltage of one polarity will be produced since the two developed voltages do not exactly equal and cancel, while if the frequency tends to vary in the opposite direction, the opposed voltages will result in a control voltage of opposite sign. Therefore, having reached a resonant intermediate frequency by the tuning in of a transmitted signal, a zero control voltage is obtained on line 202 and any tendency of the tuner to shift from this state either to a higher or lower frequency produces a voltage on the control line 202, which is positive or negative as the case may be to bring the potential of control grids 142 and 144 back to the exact tuning point and counteract any tendency to change. Thus the discriminator control voltage on line 202 maintains the system on station.

If the operator desires to tune to the next station in the band, he closes switch 252 momentarily. This applies a positive pulse to grids 142—144 from condenser 246. This is not a large pulse but drives the grids further positive to tune along the band and is just sufficient to momentarily overcome the controlling action of the discriminator to pass beyond that station which was received. As switch 252 again opens, the system will gradually scan toward the high frequency end of the band by the discharge of condenser 222 through resistors 148 and 206, allowing the grids 142 and 144 to become more positive. As the next station is approached, the discriminator signal will begin to take effect and will maintain the electrical system at resonance. Condenser 246 may by this time be recharged from battery 264, and if that station is not desired, actuation of switch 252 will cause the tuner to proceed. Upon the discharge of condenser 222 the grids 142—144 will become as positive as they can and the flow of current through the tube 130 will be at a maximum and the set tuned to the high frequency end of the band. This position or condition of the tuning apparatus is indicated by the meter 138 which, though it reads the current flow through the circuit including the magnetizing coils, may be calibrated in terms of frequency.

In order to swing to the opposite end of the band quickly so that the frequency spectrum may again be scanned, a flyback circuit is provided which includes tube 230 and condenser 226. The resistance 274, condenser 226 and resistance 232 are all connected in series between the power supply line 276 and ground. The plate 228 of the tube 230 is connected between resistance 274 and condenser 226 and in normal condition is maintained at the normal plate voltage required, such for example as 200 volts. Since condenser 226 is connected to the plate, it is charged to the same potential. The control grid 234 of tube 230 is connected directly to grids 142—144 through resistor 152 so that the bias voltage on all of the grids are the same. The negative bias on these grids continues to become less as the tuner scans the band. When the voltage of grid 234 reaches a predetermined level at the high frequency end of the band, the tube 230 fires or conducts and draws a heavy surge of plate current through resistance 274 and discharges condenser 226. This discharge current from condenser 226 flowing through resistance 232 from ground produces a high negative pulse which is impressed on the grids 142—144 through the diode rectifier 224 and resistance 150 and which also charges condenser 222 to a high negative bias again. This cuts down the plate current of tube 130, returning the tuning means to the low frequency end of the band, and the tuning starts again from the low end due to the slow discharge of condenser 222. At this time also the tube 230 cuts off, due to negative voltage on grid 234, and the plate voltage builds up to charge condenser 226 back to its previous value. During the time that the condenser 226 is charging, a high positive voltage is developed at the junction between condenser 226 and resistance 232. In order to prevent this positive pulse from appearing on the grids 142—144, the diode rectifier 224 is connected in series between resistors 150 and 232 so that only negative pulses are applied to the grids 142—144 and condenser 222.

If it is desired to return to the low frequency end of the band at any time at which the tuner is located at some intermediate frequency, the operator merely closes switch 270, which provides a discharge path for the condenser 226 and the condenser 222 is again charged negatively to a sufficient extent to return the grid bias to that producing tuning at the low frequency end of the band. Upon opening of switch 270 the condenser 226 may become recharged to its normal value.

If the receiver is on tune to a station adjacent the low frequency end of the band and the operator desires to listen to a station somewhat removed therefrom in the up-frequency direction, he may close switch 282 which prevents any stopping pulses from being applied to control the apparatus, and the tuner will continue to proceed toward the high frequency end as long as switch 282 is held closed. When the tuner reaches the vicinity of a station which it is desired to tune in, the switch 282 is opened and the tuner will stop in response to the next signal which is tuned in. If this is not the desired station, a momentary closure of switch 252 will cause the tuner to move on to the next station.

There is provided on the switch panel, therefore, a switch to cause tuning to the next adjacent station in the tuning direction, a switch to cause continued movement in the tuning direction to proceed to a different area in the band and a switch to provide a quick return to the low frequency end of the band from any intermediate point.

Since the ferrite rings 52 have very high residual magnetism, the total range of tuning with this system would be insufficient to cover the conventional broadcast frequency band. There is, therefore, added to each core a biasing coil 290, which coils are connected in series, one end of the series connection is grounded, and the other connected through a limiting resistor 292 to the A lead 14, as indicated by the arrow. This biasing coil produces a flux opposing the magnetizing flux which increases the coverage of the band to provide a sufficient range.

I claim:

1. In radio receiving apparatus, signal amplifying means, means for tuning the apparatus over a predetermined frequency band, said means including inductance means whose value may be changed, core means upon which said inductance means is wound, separate magnetizing means mounted on the core means, a source of electrical power, an electron tube connected in the circuit with the magnetizing means to control the current flow through the latter, and means for controlling the conductance of said tube according to a prescribed pattern said last-named means including a first condenser connected to and controlling the bias on the tube, a plurality of further condensers connected to said first condenser, means for applying power to said plurality of condensers independently to vary said potential on said first condenser.

2. In radio receiving apparatus, signal amplifying means, means for tuning the apparatus over a predetermined frequency band, said means including inductance means whose value may be changed, core means upon which said inductance means is wound, separate magnetizing means mounted on the core means, a source of electrical power, an electron tube connected in the circuit with the magnetizing means and the source of power to control the current flow through the magnetizing means, a control electrode in said tube to control the flow of current therethrough, a condenser connected to said control electrode, means for charging said condenser to provide a bias for said control electrode, a second electron tube in circuit with the means for charging the condenser and means interconnecting the first and second tubes to maintain the same bias on both so that the second tube controls the means for charging the condenser when the first tube reaches maximum conductance.

3. In radio receiving apparatus, signal amplifying means, means for tuning the apparatus over a predetermined frequency band, said means including inductance means whose value may be changed, core means upon which said inductance means is wound, separate magnetizing means mounted on the core means, a source of electrical power, an electron tube connected in the circuit with the magnetizing means and the source of power to control the current flow through the magnetizing means, a control electrode in said tube to control the flow of current therethrough, a condenser connected to said control electrode, means for charging said condenser to provide a bias for said control electrode, a discharge circuit containing resistance connected to said condenser so that the charge thereon may be dissipated at a prescribed rate to tune over a given band and means connected to the charging means to automatically charge the condenser when it has become discharged.

4. In radio receiving apparatus, signal amplifying means, means for tuning the apparatus over a predetermined frequency band, said means including inductance means whose value may be changed, core means upon which said inductance means is wound, separate magnetizing means mounted on the core means, a source of electrical power, an electron tube connected in the circuit with the magnetizing means and the source of power to control the current flow through the magnetizing means, a control electrode in said tube to control the flow of current therethrough, a condenser connected to said control electrode, means for charging said condenser to provide a bias for said control electrode, a discharge circuit containing resistance connected to said condenser so that the charge thereon may be dissipated at a prescribed rate to tune over a given band, and automatic means connected to said source and to said condenser to recharge said condenser quickly when the charge thereon has leaked off.

5. In radio receiving apparatus, signal amplifying means, means for tuning the apparatus over a predetermined frequency band, said means including inductance means whose value may be changed, core means upon which said inductance means is wound, separate magnetizing means mounted on the core means, a source of electrical power, an electron tube connected in the circuit with the magnetizing means and the source of power to control the current flow through the magnetizing means, a control electrode in said tube to control the flow of current therethrough, a condenser connected to said control electrode, means for charging said condenser to provide a bias for said control electrode, a discharge circuit containing resistance connected to said condenser so that the charge thereon may be dissipated at a prescribed rate to tune over a given band, and means connected to said source and to said condenser to recharge said condenser quickly when the charge thereon has leaked off, said last-named means including a second condenser connected to the first and means connected to the second condenser to charge the same, and through which a discharge path is provided, which discharge causes a charging of the first-named condenser.

6. In radio receiving apparatus, amplifying means, means for tuning said apparatus over a predetermined frequency band including inductance means connected to the amplifying means, saturable core means upon which said inductance means is mounted, magnetizing means mounted on said core to change the magnetization thereof, a source of electrical power, an electron tube having a plate, grid and cathode, a series circuit connecting the source of power, magnetizing means and the electron tube so that changes in conduction through the tube will cause changes in inductance to tune the apparatus, a condenser connected to said grid to bias the latter, a charging and discharging circuit connected to said condenser to automatically sequentially vary the charge on said condenser according to a prescribed pattern said charging and discharging circuit including controlled variably biased electronic conductive means connected to said grid and condenser to control the bias on the electron tube to vary the current therethrough to cause the means for tuning the apparatus to repetitively scan a predetermined band and means actuated by an incoming signal connected to the amplifying means and to the grid to maintain constant potential on the same when a station is tuned in to index the receiving apparatus.

7. In radio receiving apparatus, amplifying means, means for tuning said apparatus over a predetermined frequency band including inductance means connected to the amplifying means, saturable core means upon which said inductance means is mounted, magnetizing means mounted on said core to change the magnetization thereof, a source of electrical power, an electron tube having a plate, grid and cathode, a series circuit connecting the source of power, magnetizing means and the electron tube so that changes in conduction through the tube will cause changes in inductance to tune the apparatus, a condenser connected to said grid to bias the latter, a second condenser connected to said first condenser, means for charging and discharging said second condenser to charge the first condenser, and a resistance circuit to ground from the first condenser to slowly dissipate the charge thereon for tuning the apparatus.

8. In radio receiving apparatus, amplifying means, means for tuning said apparatus over a predetermined frequency band including inductance means connected to the amplifying means, saturable core means upon which said inductance means is mounted, magnetizing means mounted on said core to change the magnetization thereof, a source of electrical power, an electron tube having a plate, grid and cathode, a series circuit connecting the source of power, magnetizing means and the electron tube so that changes in conduction through the tube will cause changes in inductance to tune the apparatus, a condenser connected to said grid to bias the latter, a charging and discharging circuit connected to said condenser to vary the charge on said condenser according to a prescribed pattern, said charging circuit including a second electron tube having a grid connected to the grid of the first tube to charge the condenser when the first tube reaches its maximum conductance, and discriminator means connected to the amplifying means and to the grid to stop the variation in grid bias upon receipt of an incoming signal in the apparatus.

9. In radio receiving apparatus, amplifying means, tuning means for tuning the apparatus over a predetermined frequency band connected to the amplifying means, said tuning means including inductance means, core means upon which the inductance means are mounted, magnetizing means mounted on said core means to vary the saturation of said core means and change the inductance of the inductance means, a source of power connected to said magnetizing means, means for continuously varying the flow of current in the circuit of the magnetizing means, discriminator means connected to the amplifying means and to the means for varying the current flow through the magnetizing means to halt variation of said current upon the receipt of a transmitted signal in the amplifying means, and switching means connected between the discriminator means and ground to cause the tuning means to continuously scan without indexing on station as long as the switching means is closed.

10. In radio receiving apparatus, signal amplifying means, means for tuning the apparatus over a predetermined frequency band, said means including inductance means whose value may be changed, core means upon which said inductance means is wound, separate magnetizing means mounted on the core means, a source of electrical power, an electron tube connected in the circuit with the magnetizing means and the source of power to control the current flow through the magnetizing means, a control grid in said tube, a condenser connected to said grid, means for applying a high negative charge to said condenser, resistance means connected between said grid and ground through which said charge may slowly dissipate to allow the grid to become more positive and more current flow through the magnetizing coil to tune the apparatus over the band, discriminator means connected to the amplifying means and to the grid to stop the change in grid bias upon receipt of an incoming signal, a second condenser, rectifying means connecting the first condenser with the second to provide current flow between the two condensers in only one direction to prevent the application of positive voltages on the first condenser, and conductive means connecting the source of power to the second condenser to charge and discharge the same to in turn charge the first condenser.

11. In radio receiving apparatus, signal amplifying means, means for tuning the apparatus over a predetermined frequency band, said means including inductance means whose value may be changed, core means upon which said inductance means is wound, separate magnetizing means mounted on the core means, a source of electrical power, an electron tube connected in the circuit with the magnetizing means and the source of power to control the current flow through the magnetizing means, a control grid in said tube, a condenser connected to said grid, means for applying a high negative charge to said condenser, resistance means connected between said grid and ground through which said charge may slowly dissipate to allow the grid to become more positive and more current flow through the magnetizing coil to tune the apparatus over the band, discriminator means connected to the amplifying means and to the grid to stop the change in grid bias upon receipt of an incoming signal, a second condenser, rectifying means connecting the first condenser with the second, conductive means connecting the source of power to the second condenser to charge and discharge the same to in turn charge the first condenser, and switching means connecting said second condenser to ground to recharge the first condenser at any stage in the operation and bring the tuning system back to the low frequency end of the band.

12. In radio receiving apparatus having variable inductance tuning means, core means upon which said variable inductance tuning means is mounted, magnetizing means mounted on said core means, a source of electrical power, electron means connected in series with the source of power and the magnetizing means to control the current flow through said magnetizing means, means for automatically supplying a continuously variable bias potential which decreases from a high negative value to substantially zero and then quickly returns to a high negative value connected to the electron means to apply to the latter a slowly varying potential in one direction of change followed by a rapid variation in the opposite direction between two fixed limits to cause the tuning means to continuously repetitively scan the band, and signal actuated index maintaining means connected to the receiving apparatus and to the electron means to stop variation of the bias voltage upon the receipt of an incoming signal in the receiving apparatus.

13. In radio receiving apparatus having variable inductance tuning means, core means upon which said variable inductance tuning means is mounted, magnetizing means mounted on said core means, a source of electrical power, electron means connected in series with the source of power and the magnetizing means to control the current flow through said magnetizing means, means for automatically supplying a continuously variable bias potential which decreases from a high negative value to substantially zero and then quickly returns to a high negative value connected to the electron means to apply to the latter a slowly varying potential in one direction of change followed by a rapid variation in the opposite direction between two fixed limits to cause the tuning means to continuously repetitively scan the band, signal actuated locking means connected to the receiving apparatus and to the electron means to stop variation of the bias voltage upon the receipt of an incoming signal in the receiving apparatus, and manually operable control means connected to the means for supplying a continuously variable bias potential supply to cause the latter to either incrementally increase or decrease as desired.

References Cited in the file of this patent

UNITED STATES PATENTS

| | | |
|---|---|---|
| 2,026,758 | Turner | Jan. 7, 1936 |
| 2,283,523 | White | May 19, 1942 |
| 2,287,925 | White | June 30, 1942 |
| 2,581,202 | Post | Jan. 1, 1952 |
| 2,595,931 | De Groote | May 6, 1952 |
| 2,601,384 | Goodrich | June 24, 1952 |
| 2,668,908 | Herman | Feb. 9, 1954 |